(12) United States Patent
Luo

(10) Patent No.: US 6,228,698 B1
(45) Date of Patent: May 8, 2001

(54) MANUFACTURE OF FIELD-EFFECT SEMICONDUCTOR DEVICES

(75) Inventor: JiKui Luo, Cardiff (GB)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/292,407

(22) Filed: Apr. 15, 1999

(30) Foreign Application Priority Data

Apr. 17, 1998 (GB) ................................................. 9808237

(51) Int. Cl.[7] ............................................. H01L 21/8249
(52) U.S. Cl. ............................................ 438/234; 438/270
(58) Field of Search .................................... 438/234, 253, 438/396, 257, 258, 270, 302, 589; 437/22, 24, 26

(56) References Cited

U.S. PATENT DOCUMENTS

| | | | |
|---|---|---|---|
| 5,158,903 | * 10/1992 | Hori et al. ................................ | 437/45 |
| 5,322,802 | * 6/1994 | Baliga et al. ............................ | 437/22 |
| 5,324,971 | 6/1994 | Notley ..................................... | 257/328 |
| 5,378,655 | 1/1995 | Hutchings et al. ..................... | 437/203 |
| 5,633,181 | * 5/1997 | Hayashi ................................... | 438/234 |
| 5,665,619 | 9/1997 | Kwan et al. ............................ | 438/270 |
| 5,864,167 | 1/1999 | Cutter .................................... | 257/489 |

* cited by examiner

*Primary Examiner*—David Nelms
*Assistant Examiner*—Phuc T. Dang
(74) *Attorney, Agent, or Firm*—Steven R. Biren

(57) ABSTRACT

The manufacture of a semiconductor device, for example a MOSFET of the trench-gate type or an IGBT, includes the steps of: forming at a surface (10*a*) of a semiconductor body (10) a first mask (53) having a window (53*a*), forming a localized region (15*b*) to improve the blocking/breakdown characteristics by introducing dopant (62) into a first area of the body via the window (53*a*), and thermally diffusing the localized region (15*b*) to a greater depth than the channel-accommodating region (15*a*) before providing a source region (13). A second mask (51) of complementary window pattern to the first mask (53) is formed by providing a differently-etchable material (51') in the first window (53*a*) and then etch-removing the first mask (53) while leaving the second mask (51) at the first area where the localized region (15*b*) is present. The source region (13) is formed by introducing dopant (63) of the opposite conductivity type into a second area at the complementary window (51*a*) while masking the first area with the second mask (51). The gate (11) is provided at the second area, adjacent to where a body region (15) provides the channel-accommodating region (15*a*). A source electrode (23) is provided after removing the second mask (51), so as to contact the opposite conductivity type regions (13, 15*b*) at the surface (10*a*).

10 Claims, 4 Drawing Sheets

MANUFACTURE OF FIELD-EFFECT SEMICONDUCTOR DEVICES

BACKGROUND OF THE INVENTION

This invention relates to methods of manufacturing a semiconductor device, for example an insulated-gate field-effect power transistor (commonly termed a "MOSFET") of the trench-gate type or an insulated-gate bipolar transistor (commonly termed an "IGBT") of the trench-gate type. The invention also relates to semiconductor devices manufactured by such a method.

Such semiconductor devices are known having source and drain regions of a first conductivity type separated by a channel-accommodating region to which a gate is capacitively coupled, and a localised region of an opposite, second conductivity type which is adjacent to the source region, is contacted by the source electrode and is more highly doped than the channel-accommodating region. A trench-gate device having these features is known from U.S. Pat. No. 5,665,619. The method of manufacture disclosed in U.S. Pat. No. 5,665,619 includes the steps of:

(a) forming at a surface of a semiconductor body a first mask having a first window at a first area of the body where the trench-gate and channel are to be formed, (b) etching the trench into the body at the first window and providing a gate in the trench where a body region provides the channel-accommodating region, (c) forming over the gate in the trench a second mask of complementary window pattern to the first mask by providing a differently-etchable material from the first mask in the first window and then etch-removing the first mask from the body while leaving the second mask at the first area where the trench-gate is present, a second area of the body region being present at the complementary window in the second mask, (d) forming the source region by introducing dopant of the first conductivity type into a part of the second area while masking the trench-gate with the second mask, (e) forming a localised region of an opposite, second conductivity type by introducing dopant of the second conductivity type into the second area via the second window while masking the trench-gate with the second mask, the localised region being formed to a depth in the body shallower than that of the channel-accommodating region, and (f) providing a source electrode on the body while masking the trench-gate with the second mask, so as to contact the source region of the first conductivity type and the localised region of the second conductivity type at the surface.

This first mask in U.S. Pat. No. 5,665,619 comprises silicon nitride. The silicon nitride masks underlying areas of the body against oxidation while oxidising an upper part of the gate material to form the second mask of silicon dioxide. This second mask in U.S. Pat. No. 5,665,619 forms a protruding step to the adjacent surface of the body. This step configuration is used in a self-aligned manner to form a further mask with a smaller window, by providing sidewall extensions on the second mask at the step. Thus, U.S. Pat. No. 5,665,619 describes a modified extension of a previously-known trench-gate self-alignment technique, for example as disclosed in U.S. Pat. No. 5,378,655 (our reference PHB 33836). The whole contents of both U.S. Pat. No. 5,378,655 and U.S. Pat. No. 5,665,619 are hereby incorporated herein as reference material. By using such self-aligned techniques as disclosed in U.S. Pat. No. 5,378,655 and U.S. Pat. No. 5,665,619, the number of photolithographic masking steps which require separate alignment can be reduced and compact cellular device structures can be formed.

The localised region of the second conductivity type which is contacted by the source electrode is formed in U.S. Pat. No. 5,665,619 by dopant introduction via the second window, i.e. at a late stage in the manufacturing process. Its localised lateral dimensions are defined by overdoping with a higher dopant concentration of the first conductivity type which is introduced into a part only of the second area in step (d) to form the source region. Thus, the localised region is formed to a shallower depth in the body than both the source region and the channel-accommodating region. However, in terms of improving the blocking/breakdown characteristics of the device, it is advantageous for the localised region to be formed to a greater depth in the body than the channel-accommodating region.

SUMMARY OF THE INVENTION

It is an aim of the present invention to modify the manufacture of trench-gate semiconductor devices and other field-effect semiconductor devices so as to permit the use of self-aligned masking techniques while permitting the localised region to be formed to a greater depth in the body than the channel-accommodating region.

According to the present invention there is provided a method of manufacture wherein the localised region of the second conductivity type is formed by dopant introduction via a first window in a first mask and is thermally diffused to a greater depth in the body than the region accommodating the channel, after which a second mask of complementary window pattern to the first mask is formed by providing a differently-etchable material in the first window and then etch-removing the first mask while leaving the second mask where the localised region is present. The source region is formed by dopant introduction into a second area present at the complementary window in the second mask, i.e. after thermally diffusing the localised region, and the gate is also provided in this second area where the channel-accommodating region is provided.

Thus, the method as set out in claim 1 includes quite different steps (a) to (f) from the method steps of U.S. Pat. No. 5,665,619, and its localised region which is formed via the first window in the first mask can be diffused deep into the body before forming the source region. In this way a deep opposite-conductivity-type region can be obtained to improve the blocking/breakdown characteristics of the device, without adversely affecting the doping profile of the subsequently-formed source region.

Various preferred features in accordance with the invention are set out in claims 2 to 10.

It is particularly advantageous to use a self-aligned technique within the complementary window of the second mask in order to define the relative extents of the gate, the source region and its contact area. Various options are possible. In one preferred form, sidewall extensions of the second mask may be provided at the second window so as to form a further mask having a smaller window than the second window, and the gate may then be provided at this smaller window.

The gate may advantageously be a trench-gate present in a trench in a major surface, with the channel accomodated adjacent to a sidewall of the trench. The trench may be etched into the body at a/the smaller window to extend through a body region and into an underlying drain region. The dopant forming the source region may, for example, be implanted via the complementary window, or it may, for example, be diffused from doped sidewall extensions provided at the second window.

However, the gate may be a planar-gate which extends over an area of a major surface where the channel is accomodated. In this case, the source region may be formed in step (d) after providing the gate in step (e) so that the gate may form a composite mask pattern with the second mask when introducing the source dopant of the first conductivity type into a part only of the second area. In the case of a trench-gate, it is also possible to form the source region in step (d) after providing the gate in step (e).

BRIEF DESCRIPTION OF THE DRAWING

These and other features in accordance with the invention will now be illustrated in embodiments of the present invention, now to be described with reference to the accompanying diagrammatic drawings, in which.

Figure 1:
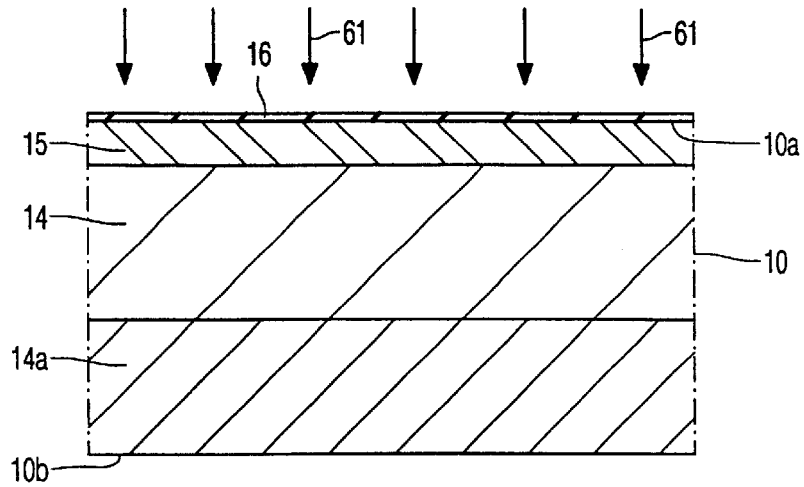
FIGS. 1 to 9 are a cross-sectional view of transistor cell areas of a semiconductor body at successive stages in the manufacture of a trench-gate semiconductor device by one example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DESCRIPTION OF THE PREFERRED EMBODIMENTS

Figure 9:
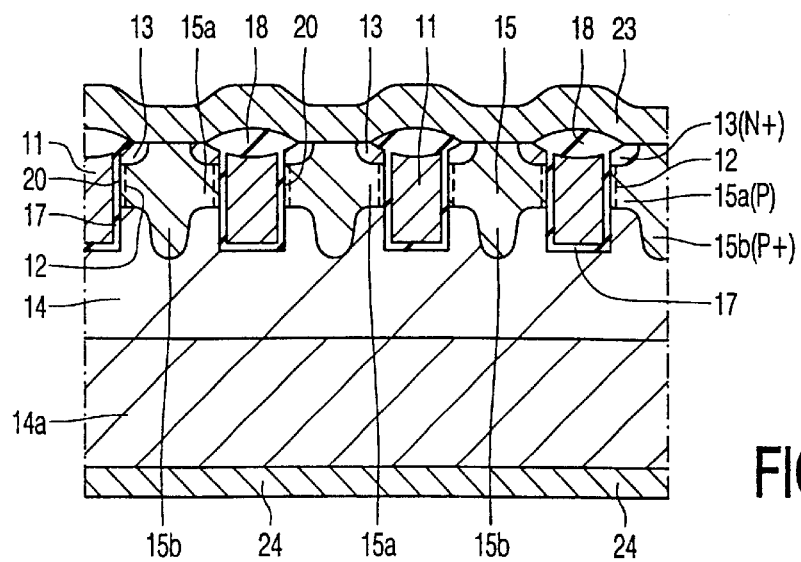

FIG. 9 illustrates an exemplary embodiment of a power semiconductor device having a trench-gate 11. In the transistor cell areas of this device, source and drain regions 13 and 14, respectively, of a first conductivity type (n-type in this example) are separated by a channel-accommodating region 15a of the opposite second conductivity type (i.e. p-type in this example). The gate 11 is present in a trench 20 which extends through the regions 13 and 15 into an underlying portion of the drain region 14. The application of a voltage signal to the gate 11 in the on-state of the device serves in known manner for inducing a conduction channel 12 in the region 15a and for controlling current flow in this conduction channel 12 between the source and drain regions 13 and 14. The source region 13 is contacted by a source electrode 23 at the top major surface 10a of the device body. By way of example, FIG. 9 shows a vertical device structure in which the region 14 may be a drain-drift region formed by an epitaxial layer of high resistivity on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

The device of FIG. 9 is manufactured by a method which, in overview of FIGS. 1 to 4, includes the steps of:

(a) forming at a surface 10a of a semiconductor body 10 (typically of silicon) a first mask 53 having a first window 53a at a first area of the body 15, (b) forming a localised region 15b of the second conductivity type (p-type in this example) by introducing dopant 62 of the second conductivity type (acceptor dopant in this example) into the first area via the first window 53a, the localised region 15b being thermally diffused to a greater depth in the body 10 than the depth of the channel-accommodating region 15a, (c) forming a second mask 51 of complementary window pattern to the first mask 53 by providing a differently-etchable material 51' from the first mask 53 in the first window 53a and then etch-removing the first mask 53 while leaving the second mask 51 at the first area where the localised region 15b is present, a second area of the body being present at the complementary window 51a in the second mask 51, and (d) forming the source region 13 by introducing dopant 63 of the first conductivity type (donor dopant in this example) into the second area after thermally diffusing the localised region 15b as in step (b) and while masking the first area with the second mask 51.

Thereafter, as illustrated in FIGS. 5 to 9, the gate 11 is provided at a part of the second area adjacent to where the body region 15 provides the channel-accommodating region 15a. The source electrode 23 is provided on the body 10 after removing the second mask 51, so as to contact the source region 13 and the localised region 15b at the surface 10a. In the embodiment illustrated in FIGS. 5 to 9, the mask 51 forms part of an extended mask 52 during the formation of the trench-gate 11. Thus, in overview of FIGS. 5 to 9, the following steps are carried out:

forming the source region 13 by introducing its dopant 63 via the window 51a, forming the mask 52 having its window 52a which is smaller than the window 51a, by providing sidewall extensions 52b on the mask 51 at the window 51a, etching a trench 20 into the body 10 at the window 52a to extend through the source region 13 and through a remaining thickness of the region 15 and into an underlying portion of the drain region 14, p1 providing the gate 11 in the trench 20 where the remaining thickness of the region 15 provides the channel-accommodating region 15a, and then providing the source electrode 23 after removing the mask 52.

By using self-aligned techniques in this embodiment, the requirement for separate mask alignments is reduced. Indeed the embodiment of FIGS. 1 to 9 is so designed that all the subsequent masking steps in the cell areas shown in FIGS. 1 to 9 can be determined in a self-aligned manner from the mask 53. This self-alignment permits a reproduceable close spacing of the transistor cells, for example with a cell pitch of less than 5 μm, i.e. with a spacing of 5 μm (or less) between centres of the neighbouring trenches 20.

No plan view of the cellular layout geometry is shown in the drawings, because the method of FIGS. 1 to 9 may be used for quite different, known cell geometries. Thus, for example the cells may have a square geometry as illustrated in FIG. 14 of U.S. Pat. No. 5,378,655, or they may have a close-packed hexagonal geometry or an elongate stripe geometry. In each case, the trench 20 (with its gate 11) extends around the boundary of each cell. FIG. 9 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells will now be described with reference to FIGS. 1 to 9.

FIG. 1 illustrates the stage in which a p-type region 15 is formed in the low-doped n-type region 14 by implantation of acceptor dopant ions 61, for example of boron. The implantation is carried out in the active cellular area defined by a window in the thick field-oxide layer (not shown). A thin layer 16 of silicon dioxide may be grown on the silicon body surface 10a, before implanting the ions 61. A heating step may be carried out to diffuse subsequently the implanted dopant to the desired depth for the region 15 in the body 10. This heating step may be delayed until after the ion implantation illustrated in FIG. 2.

Figure 2:
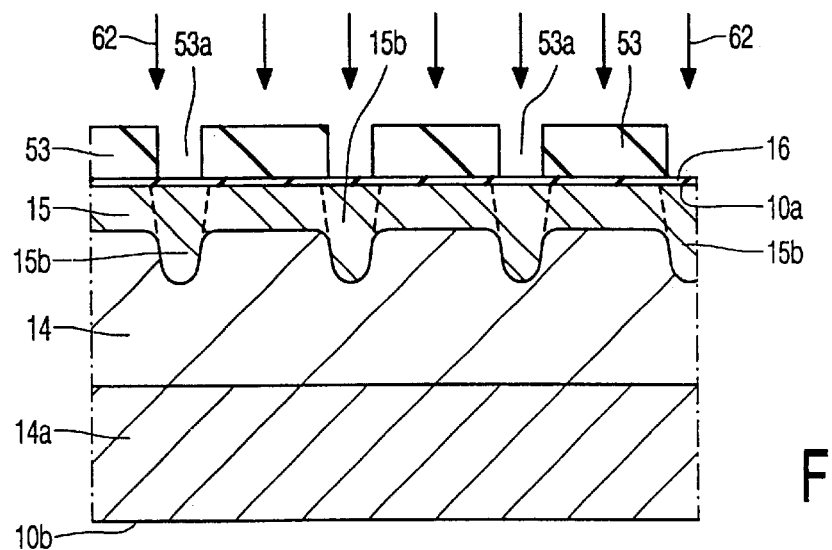

As illustrated in FIG. 2, the mask 53 is now provided at the body surface 10a. This mask 53 can be formed by depositing silicon dioxide material, and by subsequently opening the windows 53a using known photolithographic and etching techniques. In this way, a well defined window-edge can be formed for the mask 53. The thickness of the oxide mask 53 may be, for example, in the range of 1 $\mu$m to 1.5 $\mu$m. The mask 53 has an hexagonal grid pattern if an hexagonal geometry device is being manufactured. The windows 53a are narrow, for example 0.5 $\mu$m to 1 $\mu$m in width.

As illustrated in FIG. 2, a second ion implantation of, for example, boron ions 62 is now carried out. The oxide mask 53 is of sufficient thickness to mask the underlying silicon body 10 against this implantation, except at the windows 53a. The implanted dopant forms localised, highly-doped p-type regions 15b. These localised regions 15b can be formed from the surface 10a to a greater depth in the body 10 than the previously-implanted body region 15. Thus, a heating step may now be carried out to anneal and diffuse the implanted dopant 62 (and 61) to the desired depth.

Figure 3:
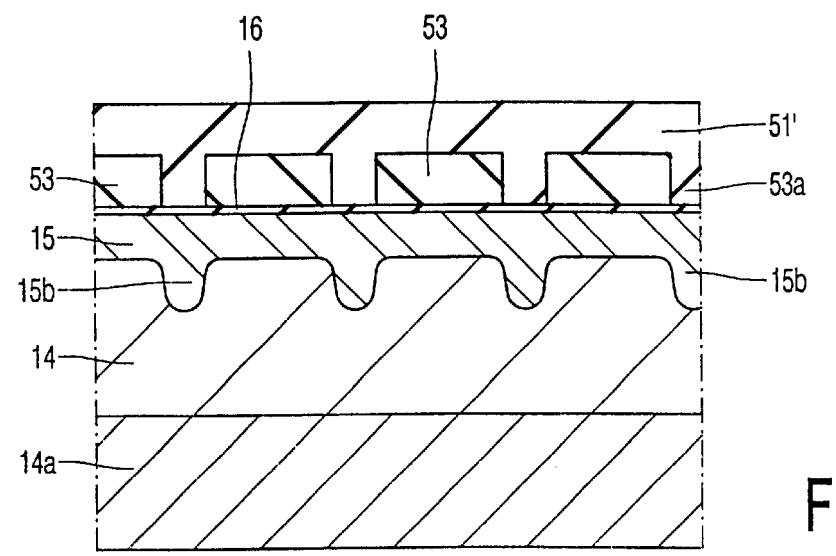

A thick layer 51' of silicon nitride is then deposited, for example using a known plasma enhanced chemical vapour deposition (PECVD) technique. As illustrated in FIG. 3, the silicon nitride is deposited in a thickness sufficient to fill the narrow windows 53a in the oxide mask 53 and to have a substantially flat upper surface. The silicon nitride layer 51 is then subjected to a known planarizing etch treatment, which etches back the layer 51' to re-expose the oxide mask 53 and to leave narrow silicon nitride pillars in the windows 53a. These silicon nitride pillars form the next mask 51 of FIG. 4.

Figure 4:
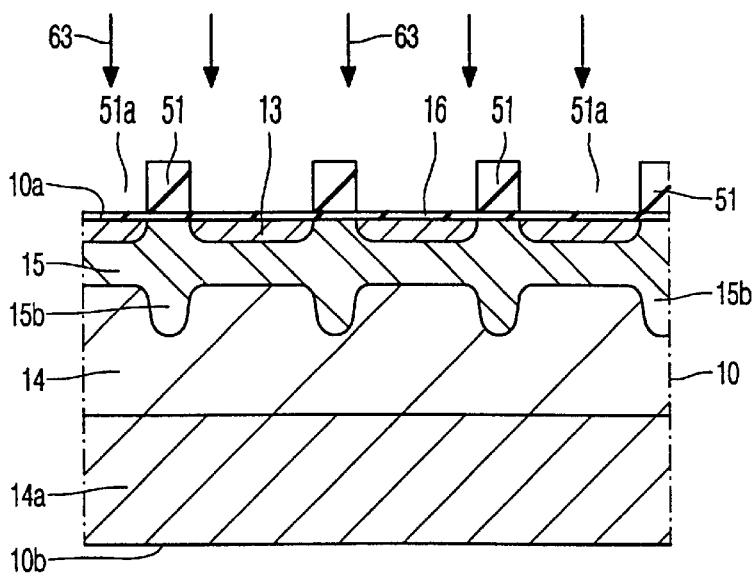

The structure of FIG. 4 is obtained by etching away the oxide mask 53, using a known selective etching treatment for silicon dioxide. The narrow silicon nitride pillars then remain at the body surface 10a as the mask 51. The mask 51 has, for example, an hexagonal dot pattern in the case of hexagonal geometry cells. An implantation of donor ions 63 (for example of phosphorous or arsenic) is now carried out to form the n-type regions 13 at the windows 51a . The silicon nitride mask 51 is of sufficient thickness to mask the underlying surface areas against this implantation of the donor ions 63. A heating treatment for annealing this donor implant may be carried out either now or later. As can be seen from FIG. 4, the n-type regions 13 are self-aligned in complementary manner with the deep p-type regions 15b.

A second silicon nitride layer 52' is now deposited over the layer structure at the surface 10a. The thickness of the layer 52' may be, for example, about 1 $\mu$m or more. Because the windows 51a are much wider than the narrow pillars forming the mask 51, the upper surface of the layer 52' is not flat but has a contour determined by the upstanding pillars forming the mask 51 at the surface 10a. The silicon nitride layer 52' is now uniformly etched back until central areas of the original windows 51a are once again opened. Due to the contoured upper surface of the layer 52', this general etch-back leaves side wall extensions 52b on the first silicon nitride mask 51. Thus, the resulting second silicon nitride mask 52 comprises the first mask 51 together with self-aligned spacers formed by these side wall extensions 52b. The resulting smaller window 52a of the mask 52 is therefore self-aligned with the wide windows 51a of the mask 51. This composite structure of the mask 52 is illustrated in FIG. 6.

Figure 6:
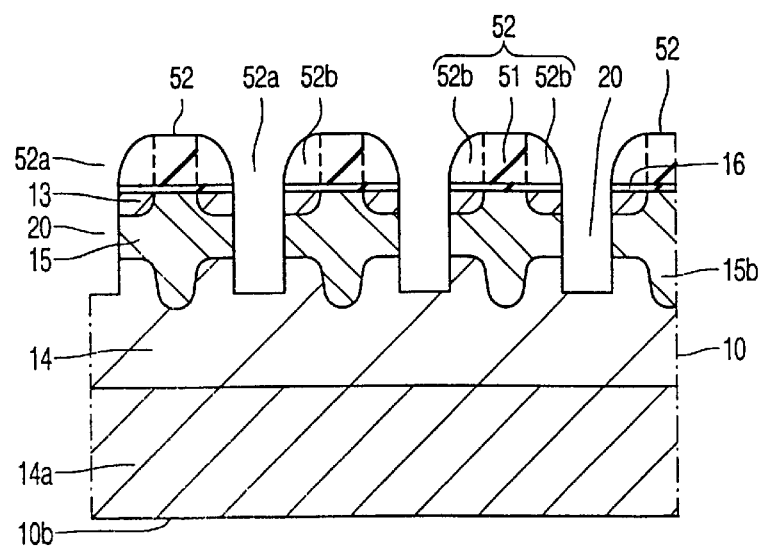

Also as illustrated in FIG. 6, an etching treatment is now carried out at the smaller windows 52a of the mask 52. When a thin oxide layer 16 is present, this oxide layer 16 is first etched away at the windows 52a. A silicon-etching treatment is then carried out in known manner, using the silicon nitride mask 52 as an etchant mask, to etch the trench 20 into the silicon body 10 at the windows 52a. The resulting structure is illustrated in FIG. 6. The layout pattern of the trench 20 is an hexagonal grid when an hexgonal geometry device is being manufactured.

Figure 7:
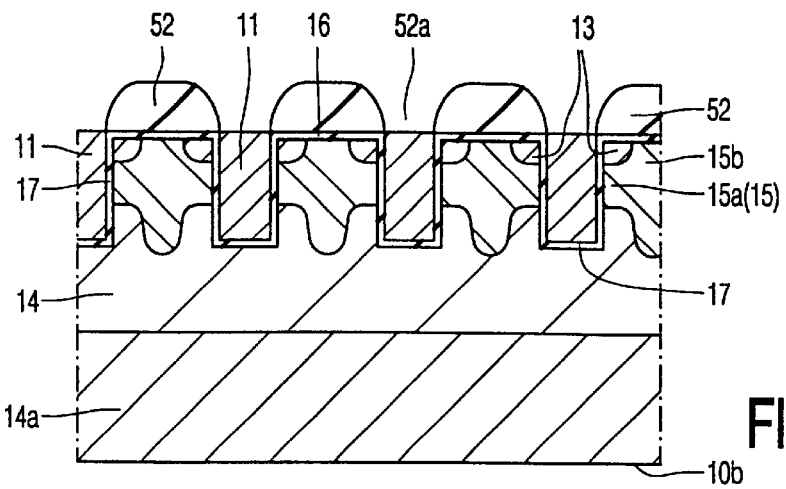

The silicon body 10 is now subjected to an oxidation treatment to form a thin silicon dioxide layer 17 on the exposed faces of the trench 20, while using the silicon nitride mask 52 to mask the silicon surface 10a against oxidation. The gate 11 may now be formed in known manner, by depositing doped polycrystalline silicon and then etching back the deposited polycrystalline silicon until it is left only in the trench 20. The resulting structure is illustrated in FIG. 7.

Figure 8:
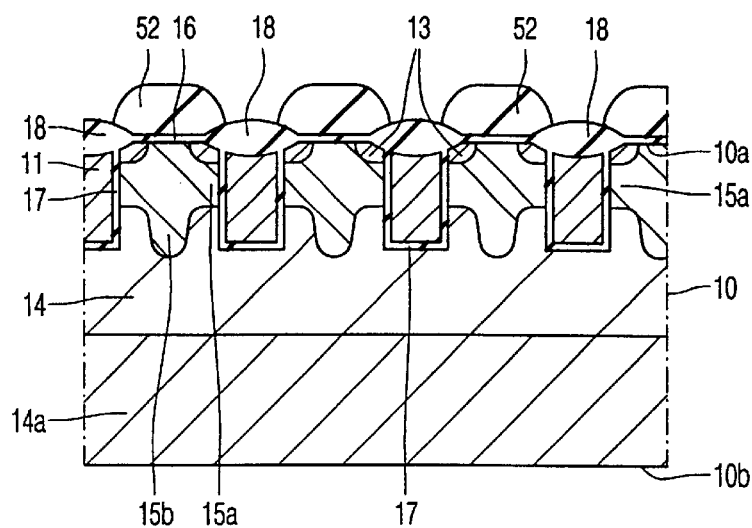

As illustrated in FIG. 8, a further oxidation treatment is now carried out to form an insulating overlayer 18 of silicon dioxide over the gate 11 in the trench 20. The silicon nitride mask 52 protects against oxidation the silicon body areas between the trenches 20. The insulating overlayer 18 is formed by oxidation of the upper part of the deposited silicon material in the trench 20. The resulting structure is illustrated in FIG. 8.

The silicon nitride mask 52 is now removed by etching, and the silicon surface 10a is exposed between the insulating overlayers 18 on the trench-gates 11. When a thin oxide layer 16 is present on the body surface 10a, an oxide etching treatment is carried out to remove the layer 16. This oxide etching treatment also thins slightly the insulating overlayers 18.

Electrode material (for example aluminium) is now deposited to provide the source electrode 23 in contact with the exposed silicon surface 10a of the regions 13 and 15. The lateral extent of the source electrode 23 is determined in known manner by photolithographic definition and etching of the deposited electrode material. As illustrated in FIG. 9, the source electrode 23 can also extend on the insulating overlayer 18 over the trench-gate 11. The higher doping of the region 15b as provided by the implanted dopant 62 forms a good contact region at the silicon body surface 10a. Furthermore, this contact region 15b extends to a greater depth in the body 10 than does the channel-accommodating region 15a, so improving the blocking characteristics of the pn junction between regions 14 and 15. In the device structure illustrated in FIG. 9, this region 15b extends slightly deeper in the body 10 than does the trench 20.

It will be evident that many variations and modifications are possible within the scope of the present invention. In FIG. 8 the insulating overlayer 18 is formed by oxidising the upper part of the deposited silicon material in the trench 20. However, an insulating overlayer 18 over the trench-gate 11 may be formed by deposition of an insulating material which is differentially etchable with respect to the material of the mask 52. In the process described for FIGS. 2 to 7, the mask 53 was of silicon dioxide, whereas the masks 51 and 52 were of silicon nitride. However, modified methods are possible in which the mask 53 is of silicon nitride, whereas one or more of the subsequently deposited layers 51' and/or 52' is of silicon dioxide. Furthermore, instead of using silicon nitride and silicon dioxide, other differently-etchable materials may be used for the masks 51, 52 and 53.

Figure 10:
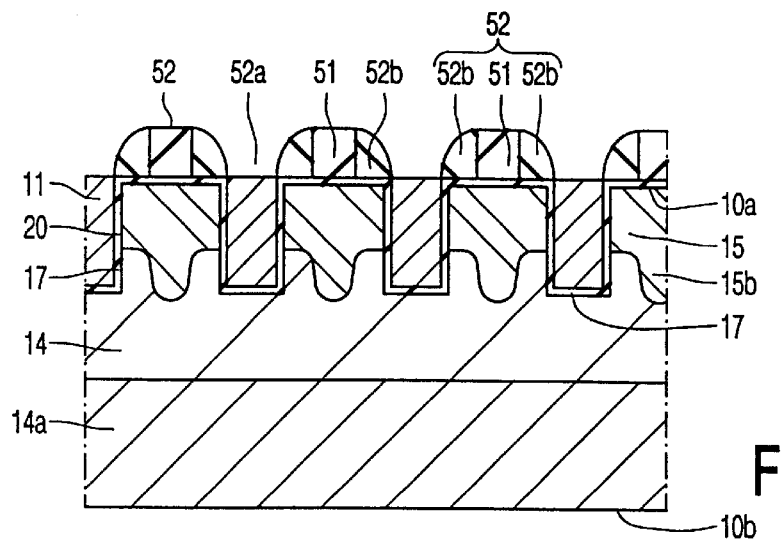
FIGS. 10 and 11 are a cross-sectional view of the transistor cell areas of FIGS. 7 to 9 at successive stages in a modified manufacturing method which is also in accordance with the invention.
Figure 11:
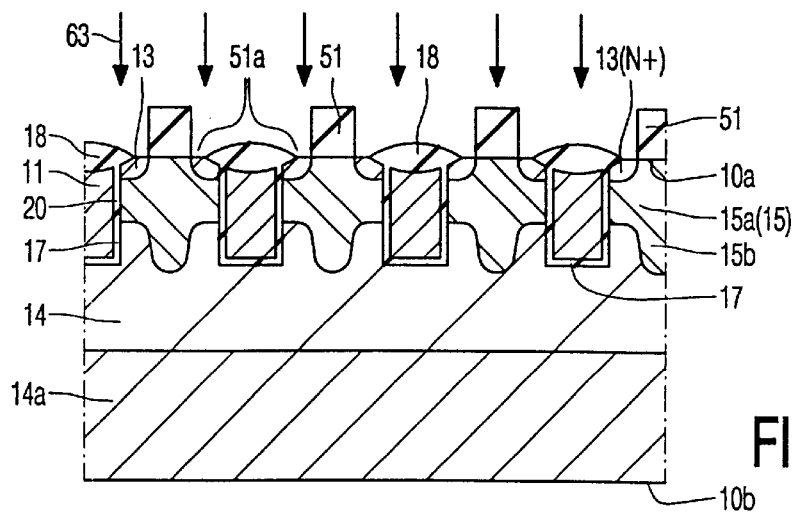

In the form illustrated in FIGS. 4 to 8, the mask 51 and the sidewall extensions 52b are of the same material, and both 51 and 52b are removed together after the FIG. 8 stage. In this process, the source region 13 is formed in FIG. 4, and the trench is etched in FIG. 6. This process sequence is particularly convenient. However, modifications are possible. Thus, FIGS. 10 and 11 illustrate a modification in which the mask 51 and the sidewall extensions 52 are of differently-etchable materials, and the source region 13 is formed later. In this case, no implantation with ions 63 is carried out at the FIG. 4 stage, and so the structure of FIG. 10 (without any source region 13) is obtained at the FIG. 7 stage. Thereafter the sidewall extensions 52 are etched away to leave the mask 51 at the surface 10a, and the FIG. 11 implantation of dopant ions 63 is then carried out to form the source region 13.

FIG. 11 shows the insulating overlayer 18 present during this dopant ion implantation. This overlayer 18 may be formed by depositing a differently-etchable insulating material at the windows 52a, and then etching away the sidewall extensions 52. If it is desired to form the insulating overlayer 18 of FIG. 11 by oxidation of the gate material, then the sidewall extensions 52 may be of silicon nitride, and the mask 51 may comprise, for example, a multiple layer of silicon dioxide and silicon nitride.

Figure 5:
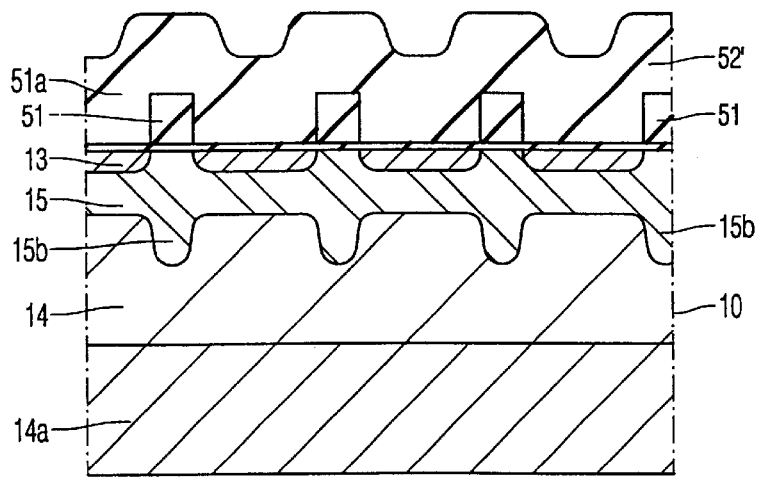

Instead of the unmasked etching of the insulating layer 52' of FIG. 5 to give the self-aligned extensions 52b, a separately aligned photolithographic and etching step may be carried out to form the window 52a of the mask 52. This separately aligned window 52a may then be used for etching the trench 20 as in FIG. 6. In this case, the mask 51 may be thinner. In a particular embodiment, this thinner mask 51 may, for example, be formed as silicon dioxide by oxidation at the window 53a in a silicon nitride first mask 53; the insulating layer 52' may be of deposited silicon dioxide; and the insulating overlayer 18 on the gate 11 may be of silicon nitride formed at the windows 52a by deposition and etch-planarisation.

Usually the conductive gate 11 is formed of doped polycrystalline silicon as described above. However, other known gate technologies may be used in particular devices. Thus, for example, other materials may be used for the gate, such as a thin metal layer which forms a silicide with the polycrystalline silicon material. Alternatively, the whole gate 11 may be of a metal instead of polycrystalline silicon. FIG. 9 illustrates the preferred situation of an insulated gate structure, in which the conductive gate 11 is capacitively coupled to the channel-accommodating region 15a by a dielectric layer 17. However, so-called Schottky gate technologies may alternatively be used in which a gate dielectric layer 17 is absent and the conductive gate 11 is of a metal that forms a Schottky barrier with the low-doped channel-accommodating region 15a. The Schottky gate 11 is capacitively coupled to the channel-accommodating region 15a by the depletion layer present at the Schottky barrier.

FIG. 1 illustrates the provision of the doping profile for the channel-accommodating region 15a (by implantation of dopant ions 61) before forming the deep localised region 15b. However, the doping profile for the channel-accommodating region 15a may be provided later, for example by implantation of dopant ions 61 at the window 51a in the mask 51 of FIG. 4. This implantation of the dopant ions 61 at the window 51a in the mask 51 may be carried out before implanting the source dopant ions 63 of FIG. 4.

The use of separate doses of ions 61 and 62 is advantageous to optimise the doping profiles for the channel-accommodating region 15a and the deep localised region 15b. However, modified processes may be acceptable for some devices in which, for example, a doped epitaxial layer is deposited to form the body region 15 in FIG. 1. In a less advantageous form, the doping profile for the channel-accommodating region 15a may even be formed by implantation of the ions 62 through a thinner mask 53, while the deeper region 15b is formed simultaneously by the ions 62 implanted at the windows 53a.

The particular example described above is an n-channel device, in which the regions 13 and 14 are of n-type conductivity, the regions 15a and 15b are of p-type, and an electron inversion channel 12 is induced in the region 15a by the gate 11. By using opposite conductivity type dopants, a p-channel device can be manufactured by a method in accordance with the invention, in which the regions 13 and 14 are of p-type conductivity, the regions 15a and 15b are of n-type, and a hole inversion channel 12 is induced in the region 15a by the gate 11.

Figure 12:
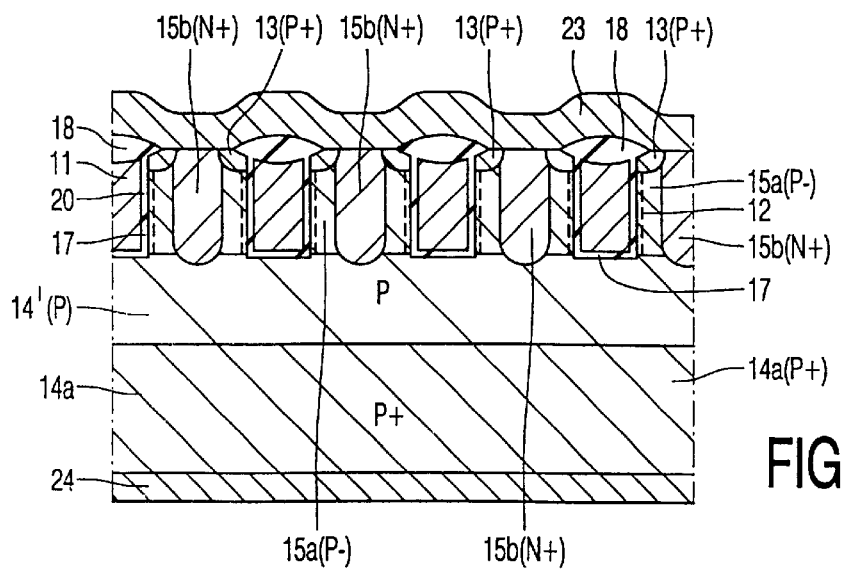
FIG. 12 is a cross-sectional view of the transistor cell areas of an accumulation-mode device which can also be manufactured by a modified manufacturing method in accordance with the invention.

Similar processing steps may be used to manufacture an accummulation-mode device in accordance with the invention. FIG. 12 illustrates a particular example of such a device of the p-channel type, having p-type source and drain regions 13 and 14a, a p-type channel-accommodating region 15a, and an n-type deep localised region 15b. In this particular example the channel-accommodating region 15a may be provided by a low-doped (P−) p-type epitaxial layer which forms the body region 15 of the same conductivity type as the source and drain regions 13 and 14a. This epitaxial layer 15 may be grown on a slightly higher doped (P) p-type epitaxial layer 14' on a highly doped (P+) p-type substrate region 14a. The n-type deep localised region 15b is formed by implantation and thermal diffusion similar to FIGS. 2 and 3, but extending through the depth of the p-type layer 15 and into the p-type layer 14'. The p-type source regions 13 and trench-gates 11 are formed by similar stages to FIGS. 4 to 8. N-type polycrystalline silicon may be used for the gate 11. In operation, a hole accummulation channel 12 is induced in the region 15a by the gate 11 in the on-state. The low-doped p-type regions 15a may be wholly depleted in the off-state, by depletion layers from the deep n-type region 15b and from the insulated gate 11. The retention of the layer 14' between the high doped substrate region 14a and the bottom of the region 15b provides a high avalanche break-down voltage for the p-n junction formed by the region 15b. A simplier device structure and process is also possible in which a single low-doped p-type epitaxial layer replaces the two layers 14' and 15.

From reading the present disclosure, other variations and modifications will be apparent to persons skilled in the art. Such variations and modifications may involve equivalent and other features which are already known in the design, manufacture and use of semiconductor devices and component parts thereof and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

Thus, for example, as well as the invention set out in the following Claims, there is also disclosed a method of manufacturing a trench-gate semiconductor device having source and drain regions 13 and 14 of a first conductivity type which are separated by a channel-accommodating region 15a adjacent to the trench-gate 11, including the steps of:

(a) forming at a surface 10a of a semiconductor body 10 a mask 51 having a window 51a at an area in the body, (b) forming the source region 13 by introducing dopant of the first conductivity type into this area via the window 51a, (c) forming on the body 10 a mask 52 having a window 52a smaller than the window 51a by providing sidewall extensions 52b on the mask 51 at the window 51a, (d) etching a trench 20 into the body 10 at the window 52a to extend through a body region 15 and into an underlying portion of the drain region 14, (e) depositing material in the trench 20 to provide a gate 11 adjacent to where the channel 12 is accommodated, and (f) providing a source electrode 23 on the body 10 after removing the mask 52 so as to expose the source region 13 and an adjacent surface region of the body for contacting by the source electrode 23.

What is claimed is:

1. A method of manufacturing a field-effect semiconductor device having source and drain regions of a first conductivity type separated by a channel-accommodating region to which a gate is capacitively coupled, and a localised region of an opposite, second conductivity type which is adjacent to the source region, is contacted by the source electrode and is more highly doped than the channel-accommodating region, including the steps of:

(a) forming at a surface of a semiconductor body a first mask having a first window at a first area of the body, (b) forming a localised region of an opposite, second conductivity type by introducing dopant of the second conductivity type into the first area via the first window, the localised region being thermally diffused to a depth in the body greater than that for the channel-accommodating region, (c) forming on the body a second mask of complementary window pattern to the first mask by providing a differently-etchable material from the first mask in the first window and then etch-removing the first mask from the body while leaving the second mask at the first area where the localised region is present, a second area of the body being present at the complementary window in the second mask, (d) forming the source region by introducing dopant of the first conductivity type into at least a part of the second area after thermally diffusing the localised region as in step (b) and while masking the first area with the second mask, (e) providing the gate in a trench at another part of the second area adjacent to where a region of the body accommodates the channel, and (f) depositing electrode material to provide a source electrode on the body after removing the second mask, so as to contact the source region of the first conductivity type and the localised region of the second conductivity type at the surface.

2. A method as claimed in claim 1, wherein the step (e) includes etching a trench into the body at the second area to extend through a body region and into an underlying portion of the drain region, and depositing gate material in the trench.

3. A method as claimed in claim 2, wherein the step (d) is carried out before the step (e), and the trench is etched in step (e) through the source region and through an underlying thickness of the body region and so into the underlying portion of the drain region.

4. A method as claimed in claim 1, wherein silicon nitride and silicon dioxide are used as differently-etchable materials for the first and second masks.

5. A method as claimed in claim 4, wherein the first mask comprises silicon dioxide, whereas silicon nitride is deposited and planarised to form the second mask of silicon nitride at the first window in the first mask in step (c).

6. A method as claimed in claim 5, wherein the gate is provided in a trench etched after the steps (a) to (c) by steps in which silicon nitride is deposited at the window in the second mask and etched back to form sidewall extensions of the second mask which narrow the window at the second area, and the trench is then etched into the body at the narrowed window to extend through a body region and into an underlying portion of the drain region, after which the gate is provided in the trench where the body region provides the channel-accommodating region.

7. A method as claimed in claim 6, wherein the gate is provided by silicon material deposited on an insulating layer in the trench, and an upper part of the deposited silicon material in the trench is oxidised to provide an insulating overlayer over the gate while using the silicon nitride of the sidewall extensions and of the first mask to mask underlying areas of the body against oxidation.

8. A method as claimed in claim 1, wherein an insulating overlayer is formed over the gate before step (f), and the source electrode provided in step (f) extends on the surface of the body and also on the insulating overlayer.

9. A method as claimed in claim 1, wherein the channel-accommodating region is a region is of an opposite, second conductivity type.

10. A method as claimed in claim 9, wherein dopant of the second conductivity type is introduced into the body before step (b) to provide the region of the second conductivity type for the channel-accommodating region.

* * * * *